United States Patent [19]
Ries

[11] Patent Number: 4,812,796
[45] Date of Patent: Mar. 14, 1989

[54] QUENCH PROPAGATION DEVICE FOR A SUPERCONDUCTING MAGNET

[75] Inventor: Guenter Ries, Erlangen, Fed. Rep. of Germany

[73] Assignee: Siemens Aktiengesellschaft, Berlin and Munich, Fed. Rep. of Germany

[21] Appl. No.: 173,672

[22] Filed: Mar. 25, 1988

[30] Foreign Application Priority Data

Mar. 30, 1987 [DE]  Fed. Rep. of Germany ....... 3710519

[51] Int. Cl.$^4$ .............................................. H01F 5/00
[52] U.S. Cl. .................................... 335/299; 361/141; 335/216
[58] Field of Search ................ 335/216, 299; 324/318, 324/319, 320; 361/19, 141

[56] References Cited

U.S. PATENT DOCUMENTS 4,486,800  12/1984  Franksen .......................... 361/141 X
4,559,576  12/1985  Ries .................................. 361/141

FOREIGN PATENT DOCUMENTS 0011335  11/1979  European Pat. Off. .
0056691   7/1982  European Pat. Off. .
0115797   1/1984  European Pat. Off. .
1614964   4/1967  Fed. Rep. of Germany .
1764369   3/1968  Fed. Rep. of Germany .
2301152   1/1973  Fed. Rep. of Germany .
2611266   3/1976  Fed. Rep. of Germany .
2646467  10/1976  Fed. Rep. of Germany .
3532396   9/1985  Fed. Rep. of Germany .
1230579   5/1971  United Kingdom .

OTHER PUBLICATIONS

IEEE Trans. Magn, MAG-17, Sep., 1981, pp. 1815–1822.
Proc. MT-6, 1977, pp. 654–662.
Proc. ICEC 6, pp. 492–496.

Primary Examiner—George Harris
Attorney, Agent, or Firm—Kenyon & Kenyon

[57] ABSTRACT

A quench propagation device for a superconducting magnet having at least one pair of superconducting coils operates so that in the event of a transition to normal-conductance (quench) of a first coil of the coil pair, which up to that point was superconducting, the second coil of this pair is also converted from the superconducting operating state to the normal-conducting state using heating arrangements thermally connected to the coils. This device is constructed so that in the event of a quench rapid magnet de-excitation and uniform current distribution and, consequently force relationships, are achieved. The heating arrangements include two auxiliary windings magnetically closely coupled with their particular assigned coils of the coil pair. The auxiliary winding material is a discrete normal-conducting conductor having a predetermined specific electrical resistance. The two auxiliary windings are short-circuited with each other so that the direction of current flow in one auxiliary winding is opposite to the direction of current flow in the second auxiliary winding.

15 Claims, 1 Drawing Sheet

QUENCH PROPAGATION DEVICE FOR A SUPERCONDUCTING MAGNET

BACKGROUND OF THE INVENTION

The invention relates to a device for quench propagation for a superconducting magnet. More particularly, the invention relates to a device for quench propagation for a superconducting magnet having at least one pair of superconducting coils, where in the event a first coil, which up to that point was superconducting, s becomes normal-conducting (quenches) where the quenching event occurs as a consequence of interference, the device causes the second coil of this pair to be converted from the superconducting operating state to the normal-conducting state with heating arrangements thermally connected to the coils.

In larger-sized superconducting magnets considerable quantities of energy are to be stored, which are, for example, in the MJ (mega-joule) range. In particular such magnets are strongly endangered in the event of an unintentional transition from the superconducting operating state to a normal-conducting state, even if this transition—also referred to as a "quench"—occurs initially only in one part of the magnet. Due to their low heat capacity, the superconducting coil conductors of the magnet, following a quench of one of the conductors, reach, very rapidly, high temperatures due to the resistance increase caused by the quench. Simultaneously, the specific resistance of the conductor also increases very quickly, which further increases the rate of heating. A consequence is excess voltages, which stress the insulation and, in the event of a flashover spark discharge, can lead to damage or destruction of the magnet.

Larger-sized superconducting magnets are frequently constructed as a combination of several superconducting coils, such as partial coils or partial windings. In order to protect these coils against damage or destruction through overheating, as through electrical flashovers, special protective measures are frequently provided. These measures may include, in particular, use of certain configurations for voltage limitation such as by bridging individual coils with protective resistors, as disclosed in German Patent Application No. DE-OS 23 01 152, semiconductor diodes, as disclosed in German Patent Application DE-OS 16 14 964, or with voltage limiters, as disclosed in German Patent Application No. DE-OS 17 64 369. In such a configuration however, in the event of a quench of one single coil, the currents of the coils of the magnet, generally connected in series, can assume widely differing patterns over time: the current of the quenched coil decreases in the process, while the current may increase in the neighbouring coils. In such a case, it is desirable to trigger cause a quench in additional or all coils of the magnet in order to de-excite the entire magnet or in order to uniformly distribute the magnetic energy converted into heat over the discrete coils. It may also be desired to favorably influence the current and field distribution during a coil quench. This is particularly important if the magnet includes a system of coils structured symmetrically in pairs. In the case of a coil pair the normally symmetric current distribution and, hence, also the field distribution, become asymmetric. The same is true of the interaction of the coils with their environment, in particular with induced eddy currents in a cryostat surrounding the coils or with ferromagnetic parts surrounding the coils such as, for example, iron screening. Under those conditions, considerable magnetic forces can occur stressing the cryogenic suspension of the coils.

Therefore, the intent is, in the event of a quench of one coil of one such a coil pair, to also trigger, as rapidly as possible, normal conductivity in the coil being symmetrical to it in order to permit the current distribution in the entire magnet and, consequently, also the force effects on the surrounding to become symmetrical. The net force on the coil pairs and on the cryostat components can in this way be reduced.

Measures for accelerating the propagation of normally conducting regions in a magnet comprising several coils are known. For example, the article "Some Basic Problems in Superconducting Magnet Design" in IEEE Transactions on Magnetics, Vol. MAG-17, No. 5, Sept. 1981, pages 1815–1822 discloses that a quench propagation can be increased through use of electrical heating elements on the coils, which are activated by a particular quench detector and fed by an external current supply.

For reasons of reliability, however, many times a "passive" quench propagation is desirable for a large superconducting magnet. A passive device is distinguished from an active device in that it exercises its voltage, temperature and force limiting functions without the use of and without the actuation of active elements such as, for example quench detectors, switches, and externally fed heating elements.

A passive quench propagation device is described, for example, in a paper entitled "Quenches in Large Superconducting Magnets" from the Proc. 6th Int. Conf. on Magnet Technology (MT-6), Bratislava (CSSR), Aug. 28–Sept. 2, 1977, pages 654 to 662. According to this device a superconducting magnet is to be wound on a coil former, which is a good electrical conductor such zs as highest grade aluminum, or on a secondary short circuit winding. In the event of a quench, the coil former or secondary short circuit winding takes over a part of the energy, functioning as transformer, and simultaneously heats the still superconducting parts of the magnet. In such a device, however, large losses of helium coolant occur in the process of informal excitation and de-excitation due to induced currents. If the rate of change is too high, then even the danger of triggering a quench unintentionally exists.

Another quench propagation device is disclosed in EP-B-0 115797. This quench spreading device works passively. This device, which is provided for a superconducting magnet with several discrete coils or partial coils, contains special heating arrangements in the form of films of normal-conducting material, which are connected in good heat-conducting contact with an associated coil. The operating voltages required in the event of a quench for these heating elements are tapped from a network of quench protecting resistors. In this case, however, the quench propagation from the quenched coil to the remaining coils takes place relatively slowly so that for a correspondingly long transition of time in the magnet correspondingly non-uniform conditions of current distribution and, hence, force effects can occur.

Corresponding magnets are applied, for example in the field of medical technology, as static ground field magnets in installations for nuclear spin tomography as disclosed in EP-B-0 011 335 or EP-A-0 056 691. Such ground field magnets contain in general several, for example four or six, annular superconducting single coils, which are arranged symmetrically in pairs with respect to a center plane. These superconducting single coils are expediently bridged with quench protective resistors or diodes. In that case, however, in the event of a quench, due to the non-symmetry of the single coil currents in the coils lying on both sides of the center plane, axial forces between these coils, cryogenic shields and possibly a present iron shielding can occur. These forces are, in a magnetic coil system for nuclear spin tomography, by far greatest at the front face single coils, since these coils in general have the greatest number of windings.

SUMMARY OF THE INVENTION

The device of the present invention improves the passive quench propagation device whereby the danger of unintentional triggering is decreased in that rapid magnet de-excitation is made possible.

The problems described above are solved by an apparatus according to the present invention which includes a discrete conductor of normal-conducting material having a predetermined specific electrical esistance and in which the auxiliary windings assigned to the coils of the coil pair are short circuited with each other so that the direction of current flow in one auxiliary winding is opposite to the direction of current flow in the second auxiliary winding.

One of the advantages arising from this design of the quench propagation device is that the second coil of a coil pair assigned to a quenching coil is converted relatively rapidly to the normal-conducting state without the necessity of special external (active) components. In the event of a quench of one coil of a coil pair voltages are induced in its auxiliary winding, due to magnetically closed coupling of the auxiliary windings with their assigned coils. The auxiliary winding which is a counterpart of the auxiliary winding associated with the quenched coil functions as a heater driving a heating current on the second coil of the coil pair and triggers a quench there as well. In this connection it is of particular advantage that the structure of the two auxiliary windings assigned to a coil pair is quasisymmetric; i.e. the roles of induction and heat development are reversed depending on the origin of the initial quench occurrence. During operational activation and de-activation, due to the antisymmetric wiring of the two auxiliary windings, voltage and heat output are practically zero. That is, even s rapid operational change cannot trigger a quench, and the losses of cryogenic coolant caused by the auxiliary windings are correspondingly minimal.

BRIEF DESCRIPTION OF THE DRAWINGS

For further elucidation of the invention, reference is made to the drawings, in which.

DETAILED DESCRIPTION

The quench propagation of the present invention can advantageously be provided for all superconducting magnets, which have at least one pair of superconducting single coils.

Figure 1:
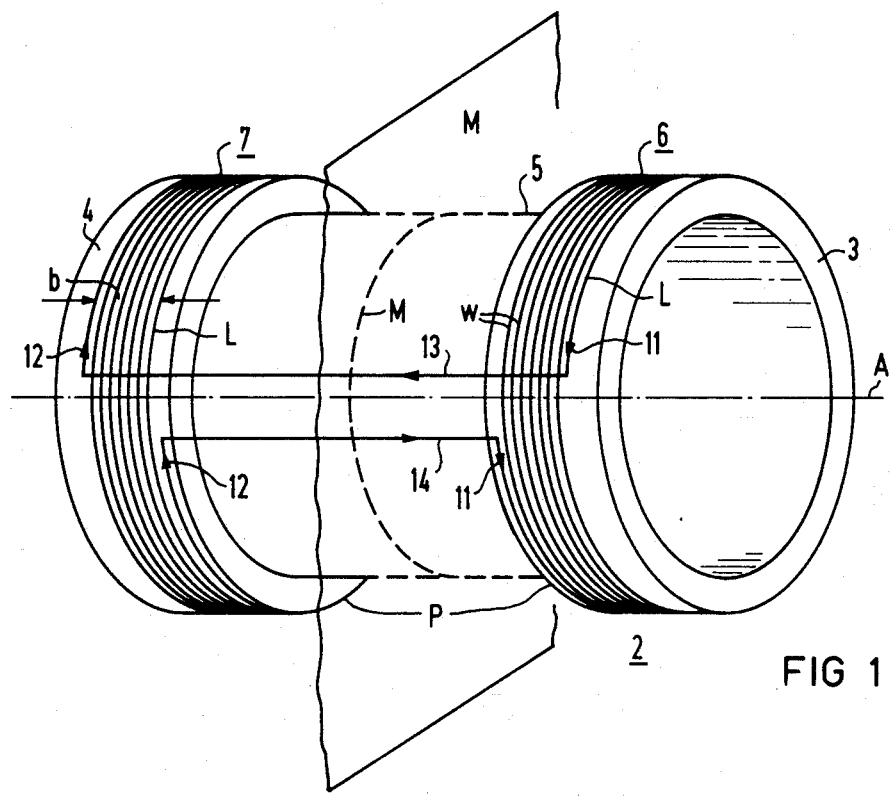
FIG. 1 illustrates a quench propagation device according to the present invention.

The embodiment shown schematically in FIG. 1 in view is based on two superconducting coils in the region of the front sides of a corresponding magnet 2.

These coils, largely identical at least with respect to construction, are designated 3 and 4 and are arranged symmetrically with respect to an imaginary center plane M of the magnet. For example, the coils 3 and 4 are located on a tubular carrier 5 around an axis A, the intersection of which with the imaginary center plane M is drawn in a dotted line. These coils 3 and 4, forming a coil pair P, are in addition, according to the invention, equipped with a device for propagation of a quench, which occurs in one of the two coils (for example in coil 3) as rapidly as possible onto the other coil (coil 4) of coil pair P and so effect a more symmetrical current drop in the two coils. Under those conditions, eddy current forces, discrete net forces, largely balance, with the cryogenic supports required for the coils correspondingly being relieved of load.

The device according to the invention for quench propagation has one single-layer auxiliary winding 6 or 7 of at least one discrete, tape or wire-shaped insulated conductor L. However, they can also be constructed of several conductors. The conductor L consists of normal-conducting material with a predetermined specific electrical resistance. Several windings "W" of the conductor L are arranged as the auxiliary windings 6, 7 assigned to the coils 3 and 4 respectively in each case in such a way that good thermal contact to the particular coil is ensured. Of course, instead or in addition, windings w of the auxiliary windings can also be located on the underside or on at least one of the narrow-sided front surfaces of their assigned coils The two auxiliary windings 6 and 7 are so connected with each other, i.e. short-circuited, that the direction of current flow indicated by the arrows 11 in the intermediate coil 6 is opposite to the current flow direction illustrated through arrows in the auxiliary winding 7. The required two axial connection conductors between the two auxiliary windings 6 and 7 are designated in the FIG. 1 by 13 and 14. No electrical connection exists from the auxiliary windings 6 and 7 to the rest of magnet 2.

Following a coil quench, assumed to occur for example, in coil 3, a voltage is induced in the auxiliary winding 6 magnetically closely coupled to quenched coil 3. The counterpart auxiliary winding 7 acts as heater and drives a heating current on the second coil 4 and, consequently, triggers a quench there as well.

The structure of the device according to the invention for propagation of quench is hence quasi-symmetrical; i.e. the roles of induction windings (for example auxiliary winding 6) and heater winding (auxiliary winding 7) are reversed depending on the origin of the quench occurrence. In the course of operational excitation and de-excitation of the magnet, by contrast, voltage and heat output are minimal due to the antisymmetrical connection of the two auxiliarY windings 6 and 7.

A rapid quench trigger demands good electrical conductivity of the auxiliary windings. On the other hand, the temperatures related electrical resistance of the auxiliary winding on the quenched coil, which now heats up, should not increase too rapidly because this weakens the induced current. Advisably a material is selected for conductor L, having a specific electrical resistance $\rho$, at 4.2° K., which lies between $10^{-9}$ and $10^{-11}$ $\Omega$.m. So that further a thermally coupled winding can still operate in the range of the temperature-dependent residual resistance, a value of the residual resistance ratio $\rho$ (at 300° K.)/$\rho$ (at 4.2° K.) of between approximately 50 to 500 should not be exceeded With single-layer auxiliary windings of tape or wire-shaped copper or aluminum directly on the particular coils, the listed demands can readily be met. It is advisable to provide as the stabilization material of the superconductors, the material of which the superconducting coils are built. Additionally, for conductor L of the auxiliary winding, a wire diameter should be chosen, which is similar to that of the superconductor of the assigned coil. In this way, good heat contact and simple winding technique can be ensured. To this end, the auxiliary windings must be wound tightly onto the particular coils, since otherwise the Lorentz force on the heating side can lift the conductor off the coil and lessen the thermal contact. The number of windings has practically no influence on the effect; that is, a few closely wound centimeters suffice For reasons of sufficient heat diffusion it is advantageous if the auxiliary windings are produced of windings closely wound one next to the other, with an axial minimum width "b" of the windings being 2 cm.

For electrical insulation between the auxiliary windings and their assigned coils, in general, a normal wire insulation is sufficient, which possibly is additionally reinforced by a thin insulating film. On the other hand, the auxiliarY windings must be thermally sufficiently insulated against the cryogenic medium helium in order to prevent the heat of the auxiliary windings from being too rapidly eliminated in the event of a quench. To that end, the auxiliary windings can be thermally insulated against the cryogenic medium, for example with layers of wax or synthetic resin a few mm thick.

For a rough estimate of the effect of a quench propagation device according to the invention it may be assumed that the magnetic flux penetrating the coils and their particular assigned auxiliary winding and, consequently, the induced voltage $U_i$ winding are approximately of the same order of magnitude. In a fully quenched coil $U_i$ is approximately also identical to the resistive voltage drop $U_r$/winding, if all current flows in the normally conducting stabilization material of the superconductor of the coil. The current densities $j_h$ in the auxiliary windings are then proportional to $U_i$ and $\rho^{-1}$. If copper is chosen as material for the auxiliary windings 6 and 7 with $\rho$ (4.2° K.) being approximately 1 to $2 \times 10^{-10}$ $\Omega$.m, then approximately one half the current density $j_h$ of that in the conductor of the assigned superconducting coil 3 or 4 can be achieved. The quench propagation from the heating auxiliary winding in the topmost coil layer takes place approximately in that time which in a coil, of current density $j_h$ is required for a quench of a one layer by a quench zone Which progresses with the propagation velpcotu $V_r$. According to the article "Protection of the pulsed superconducting Dipole ALEC", Proc. 6th Int. Cryogenic Engng. Conf. - ICEC 6, Grenoble, 11-14 May, 1976, pages 492 to 496 (FIG. 2) $V_r$ is a few cm/sec; i.e. the trigger time for a quench is accordingly a few 1/10 seconds. This is short enough compared to the time to build the maximum force, a few seconds, in order to effectively reduce the load on the cryogenic coil supports.

In the embodiment illustrated in FIG. 1 the assumption was made that the magnet 2 has only two coils 3 and 4 arranged symmetrically to each other, to which a quench propagation device according to the invention is to be assigned.

It is understood that the magnet can contain additional pairs of superconducting coils with a quench propagation device being provided for each additional pair or also only for a few of the pairs. Beyond that, it is also possible to combine several coils considered to be partial coils or partial windings of a magnet, so that they form a pair of coil sets arranged symmetrically to each other. The thus created pair of coil sets can then be equipped with a quench propagation device according to the invention with one auxiliary winding to be assigned to one coil set. In this embodiment, coils 3 and 4 shown in FIG. 1 are not both just one single coil; rather, coils 3 and 4 can be combined from several discrete coils to form one coil set. If a superconducting magnet has more than one pair of individual coils, which are symmetrical to each other, and if one of these coil pairs in the event of a quench of one of its two coils calls forth significantly greater asymmetric forces than the at least one additional coil pair, it becomes possible in this case to assign solely to the coils of the coil pair with the greater force effect a quench propagation device according to FIG. 1. The remaining less critical coils can then be quenched with planar ohmic heat elements, which are placed in the series circuit of the auxiliary windings of the quench spreading device.

Figure 2:
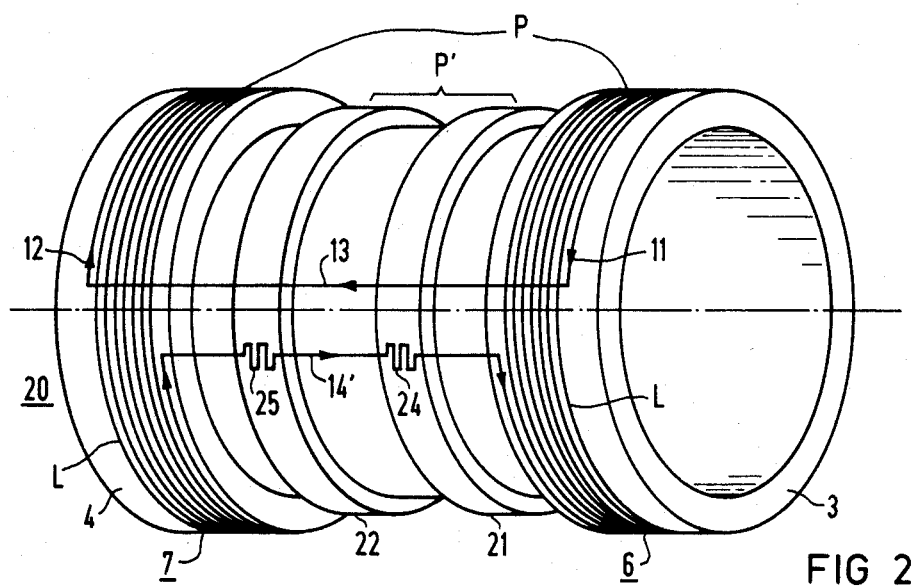
FIG. 2 illustrates a specific design possibility for such a device.

A corresponding embodiment for a magnet with two pairs of superconducting single coils forms the basis of the embodiment shown schematically in FIG. 2. An oblique view, as for FIG. 1, was chosen. parts that are identical in the Figures are provided with identical reference numbers. FIG. 2 differs from FIG. 1 in that the magnet labeled 20, has between its frontal face coils 3 and 4 forming an outer coil pair P, an additional inner coil pair P, with coils 21 and 22, which, for example have a lower ampere winding number than their adjacent superconducting coils 3 respectively 4. The quench propagation device provided for this magnet 20 contains again the two auxiliary windings 6 and 7 around the assigned superconducting coils 3 respectively 4. These two auxiliary windings 6, 7 are connected with each other through axially extending connection conductors 13 and 14', with the predetermined directions of current flow being ensured. At the coils 21 and 22 of the inner coil pair P' ohmic heat elements 24 and 25, are arranged with good heat-conducting contact and are series-connected in at least one of the two connection conductors, for example, in the connection conductor 14'. The electrical series resistance of both heat elements together should advantageously be 1 to 10 times the series resistance of both auxiliary windings 6 and 7. In case of a quench of one of the two coils (3 or 4) of the outer coil pair P, then in the series circuit a heating current is called forth by the quenching coil, which can heat up the ohmic planar heating elements 24 and 25 so that the two coils 21 and 22 of the inner coil pair P' assigned to those heating elements also quench.

What is claimed is:
1. An apparatus comprising:
a first pair of superconducting coils; and
a pair of auxiliary windings, each auxiliary winding being closely magnetically coupled to one of said first pair of superconducting coils and comprising a discrete conductor of normal-conducting material having a predetermined specific electrical resistance, with the auxiliary windings assigned to the coils of the coil pair short-circuited with each other so that the direction of current flow in one auxiliary winding is opposite to the direction of current flow in the second auxiliary winding.

2. The apparatus of claim 1, wherein the auxiliary windings comprise one insulated tape conductor of a material, which is a good electrical conductor, said predetermined specific electrical resistance $\rho$ at 4.2° K. being between $10^{-9}$ and $10^{-11}$ $\Omega$.m.

3. The apparatus of claim 2, wherein said conductor of the auxiliary windings comprises a material having a residual resistance ratio $\rho$ (300° K.)/$\rho$ (4.2° K.) which lies between 50 and 500, wherein $\rho$ (T) is the specific electrical resistance at a particular temperature (T).

4. The apparatus of claims 1 to 3, wherein said conductor of the auxiliary windings comprises a normal-conducting material, which serves as stabilizing material for the superconductors, of which the assigned superconducting coils are constructed.

5. The apparatus of claim 1, wherein said conductor of the auxiliary windings is selected from a group consisting of copper and aluminum.

6. The apparatus of claim 4, wherein said conductor of the auxiliary windings is selected from a group consisting of copper and aluminum.

7. The apparatus of claims 1 to 3, wherein said auxiliary windings each comprise one layer of several closely wound windings of the said conductor.

8. The apparatus of claim 4, wherein said auxiliary windings each comprise one layer of several closely wound windings of the said conductor.

9. The apparatus of claim 5, wherein said auxiliary windings each comprise one layer of several closely wound windings of the said conductor.

10. The apparatus of claims 1 to 3, wherein said auxiliary windings cover in each instance a region of the superconducting coil respectively assigned to each auxiliary winding, said auxiliary windings having an axial minimum width of 2 cm.

11. The apparatus of claims 1 to 3, wherein said coil pair of the magnet comprises annular superconducting coils arranged symmetrically about a center plane.

12. The apparatus of claims 1 to 3, further comprising:
   a pair of connection conductors for connecting said auxiliary windings;
   an additional pair of superconducting coils arranged between the superconducting coils of said first coil pair of the magnet; and electrical heating elements arranged in good thermal contact with said additional coil pair, said electrical heating elements being connected to at least one of said connection conductors which extend between the auxiliary windings assigned to the superconducting coils of the first coil pair.

13. The apparatus of claim 10, wherein an electrical series resistance of said electrical heating elements is 1 to 10 times as great as an electrical series resistance of the two auxiliary windings.

14. The apparatus of claims 1 to 3 further comprising:
   a cryogenic medium provided for cooling the superconducting coils; and
   means for thermally insulating said auxiliary windings from said cryogenic medium.

15. The apparatus of claim 1, wherein the auxiliary windings comprise one insulated wire-shaped conductors of a material, which is a good electrical conductor, said predetermined specific electrical resistance $\rho$ at 4.2° K. being between $10^{-9}$ and $10^{-11}$ $\Omega$M.

* * * * *